United States Patent [19]

Feucht

[11] 3,845,324

[45] Oct. 29, 1974

[54] DUAL VOLTAGE FET INVERTER CIRCUIT WITH TWO LEVEL BIASING

[75] Inventor: Charles A. Feucht, S. Elgin, Ill.

[73] Assignee: Teletype Corporation, Skokie, Del.

[22] Filed: Dec. 22, 1972

[21] Appl. No.: 317,579

[52] U.S. Cl. .................................. 307/205, 307/214
[51] Int. Cl. ........................................... H03k 19/40
[58] Field of Search ........ 307/205, 221 C, 251, 279, 307/304, 214

[56] References Cited

UNITED STATES PATENTS

| | | | |
|---|---|---|---|
| 3,506,851 | 4/1970 | Ponkinghorn | 307/304 |
| 3,601,637 | 8/1971 | Spence | 307/251 |
| 3,619,670 | 11/1971 | Heimbigner | 307/251 |
| 3,629,618 | 12/1971 | Fujimoto | 307/304 |
| 3,648,065 | 3/1972 | Hoffman | 307/221 C |
| 3,649,843 | 3/1972 | Redwine | 307/205 |
| 3,660,684 | 5/1972 | Padgett | 307/251 |
| 3,710,271 | 1/1973 | Putman | 307/205 |

*Primary Examiner*—John S. Heyman
*Attorney, Agent, or Firm*—K. R. Bergum; J. L. Landis

[57] ABSTRACT

An inverter circuit utilizing transistors of the MOS-FET type, for example, incorporates positive capacitive feedback and both high and low voltage power sources in a manner that results in an exceedingly low figure of merit (speed-power product). The high-voltage source is associated with an a-c grounded portion of the circuit and, in conjunction with a "kicker" type of capacitive voltage feedback, produces a relatively high overdriving gate-to-source voltage differential on a load transistor so as to effect rapid output signal transitions. The low-voltage source, connected to the load transistor, which forms a part of a selectively d-c grounded output portion of the circuit, allows the use of relatively small load and driver transistors so as to conserve chip space, minimize total circuit power dissipation, increase transistor yields and reduce manufacturing costs.

5 Claims, 3 Drawing Figures

FIG. 1
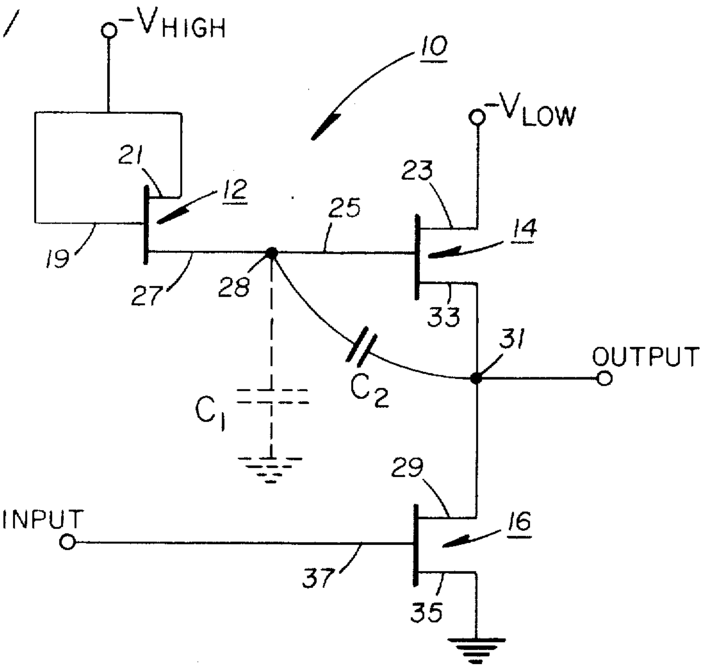
FIG. 2
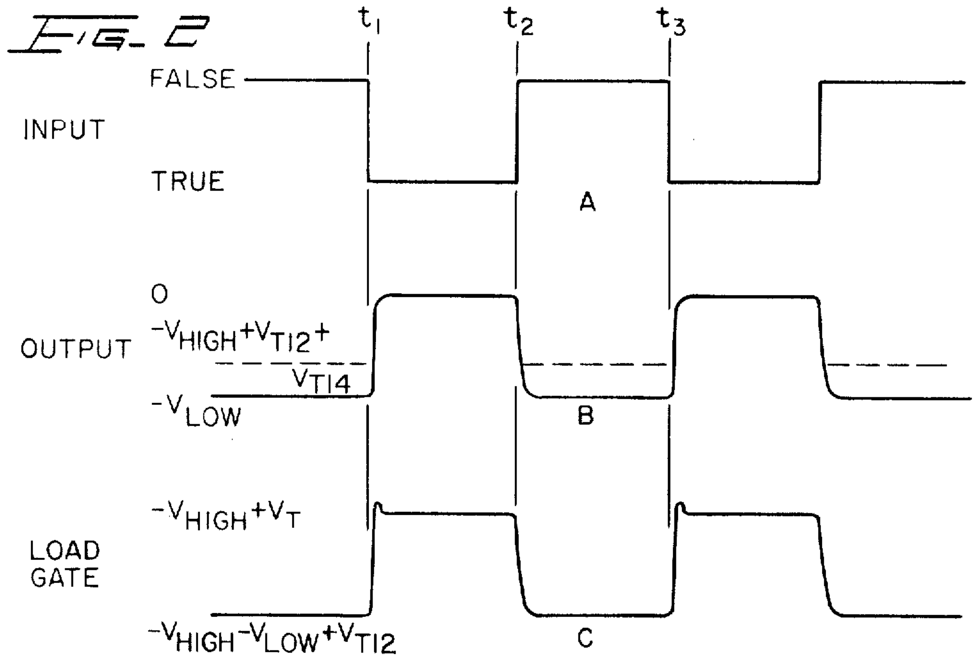
FIG. 3
| TRUTH TABLE | |
|---|---|
| INPUT | OUTPUT |
| 1 | 0 |
| 0 | 1 |

DUAL VOLTAGE FET INVERTER CIRCUIT WITH TWO LEVEL BIASING

BACKGROUND OF THE INVENTION

1. Field of the Invention

This invention relates to signal inverting circuitry and, more particularily, to integrated field-effect transistor inverter circuitry which exhibits substantially improved power dissipation and logic switching response time characteristics.

2. Description of the Prior Art

Integrated circuit inverters of the field-effect type have taken many forms heretofore, broadly falling into two basic categories, namely, static and dynamic inverters.

With respect to static inverters, in particular, they are characterized by the fact that the output signal is always a true, or valid time-coincident, complementary representation of the applied input signal. In many logic signal processing applications requiring the use of inverters, drivers, or gating devices, the metal-oxide-silicon field-effect transistor, hereinafter generally referred to simply as a "MOSFET," has been preferred for a number of reasons.

More specifically, while MOSFETs heretofore have not exhibited the switching speeds realized with bipolar transistors, for example, they do advantageously exhibit a very high input impedance, such as realized with a solid state amplifier, and a transfer characteristic ($g_m$) similar to that exhibited by a pentode vacuum tube. By reason of their essentially two-dimensional structural nature, MOSFETs also readily lend themselves to high volume manufacture in integrated or monolithic circuits.

Notwithstanding the many attributes of MOSFETs, when utilized as the active devices in medium or large scale integration (MSI or LSI) circuits, the size of each device and the power dissipated thereby become very important circuit design factors for a number of very significant reasons. First, it is readily apparent that as the size of a MOSFET is reduced, the packing density thereof on a given substrate or chip can be increased. Equally important, however, is the fact that as the MOSFET size is reduced, power dissipation and stray capacitance effects decrease, and device yields increase.

Considered more specifically, with respect to power dissipation, the *d-c* current through a given size MOSFET essentially varies as the square of the applied drain voltage. Stated another way, for a given device geometry and gate voltage, if the drain voltage is reduced by a factor of two, the power dissipated by a MOSFET operated in the non-saturated region is reduced approximately by a factor of four. It thus becomes very important that the *d-c* supply voltage connected to the drain of an output MOSFET, in particular, be as low as possible.

Another factor determinative of the d-c current flow through a MOSFET is the width-to-length (W/l) dimensions of the enhancement (or depletion) mode channel. More specifically, as the width (W) of the channel is made smaller, the *d-c* power dissipated is reduced for given applied drain and gate supply voltages. It, of course, is well known that the minimum channel size allowable is determined, in part, by both the minimum input impedance and the degree of input-output isolation required for a given circuit application.

Stray capacitance effects both within and between MOSFETs also vary directly with voltage-current requirements. Hence, packing density is dependent to a great extent on device power requirements. The inherent two-dimensional nature of MOSFETs, of course, also make power-dependent thermal factors of paramount importance in the design of circuits and systems utilizing such devices.

With respect to product yield, it has been found to increase as the size of a MOSFET decreases. This is due primarily to the fact that as the required silicon gate oxide areas increase, there is a corresponding increase in the probability of the occurance of pin holes and/or pits therein, which defects result in internal shorts or leakage problems.

Inverter circuit switching speed or, more precisely, output signal transition speed, and the output voltage swing requirements are also important factors that partially determine the minimum level of supply voltage(s) that can be utilized with a given MOSFET inverter. This is particularly true with respect to the gate control bias of the load-functioning MOSFET(s). As is well known, the output voltage from an operated MOSFET is less negative than the gate voltage thereof by one threshold value of voltage. Inasmuch as many MOSFET inverters use at least two gate-coupled stages, the output from the last stage may be two or more thresholds lower than the supply voltage. Accordingly, such multiple threshold voltage drops have disadvantageously necessitated a higher supply voltage than desired in many multi-stage inverter, driver, or gating circuits.

In accordance with one prior art solution to this problem, and particularly with respect to compensating for a two threshold voltage drop in a two stage MOSFET inverter circuit, the output voltage is fed back from the source to the gate of the output or load device by means of positive, capacitive voltage feedback. Such a feedback technique produces a "kicker" voltage that advantageously allows the gate voltage of the load MOSFET to periodically rise considerably above the drain supply voltage of the device. One such circuit is described in R. W. Polkinghorn et al. U.S. Pat. No. 27,305, herein incorporated by reference. However, in a multi-stage, single voltage source inverter, there still remains the necessity of having to utilize a common level of supply voltage sufficient to compensate for more than one threshold voltage drop.

Such a relatively high supply voltage also necessarily imposes size reduction limitations on the load-functioning MOSFET(s) in the last stage of most inverters of the type in question. More specifically, load MOSFETs essentially function as variable series resistors connected between the voltage supply and ground. As such, a load MOSFET, when biased with a relatively high multi-threshold compensating supply voltage, must necessarily be designed with relatively large dimensions, particularly with respect to the channel length, in order to limit the current that flows therethrough and, thereby, maintain the power dissipated therein within acceptable limits.

There thus has been an urgent need for a multi-stage MOSFET inverter circuit that minimizes power dissipation and maximizes output signal transition speed. In other words, there has been a need for an inverter, driver or gating circuit exhibiting a minimum speed-power product which is referred to as the figure of merit for such circuits. Minimizing both the size of and biasing voltages applied to MOSFET devices, of course, is also very desirous in terms of reducing the stray capacitances within a given device, and between adjacent devices, as well as with respect to substantially improving the yield of such devices because of smaller silicon gate oxide areas.

SUMMARY OF THE INVENTION

It is an object of the present invention to provide an improved inverter circuit wherein fast output signal transitions are achieved with minimal power dissipation, so as to achieve a very low figure of merit, or speed-power product.

In accordance with the principles of the present invention, this and other objects are accomplished by utilizing both a low voltage power source and positive capacitive feedback in an inverter circuit comprised of field-effect transistors (FET's), preferably of the metal-oxide-silicon (MOS) type, and hereinafter referred to as MOSFETs. While the preferred embodiment of the invention is described herein in connection with MOSFETs of the p-channel enhancement mode type, it should be understood, of course, that the principles of the invention apply equally well to circuits using p-channel depletion mode devices, as well as n-channel enhancement or depletion mode devices.

In one preferred illustrative embodiment, three MOSFETs are employed: one connected to the high voltage source functions as a switching transistor, a second connected to the low voltage source functions as a load transistor with positive feedback, and the third connected in series with the second functions as a signal input driver transistor. The present inverter circuit takes advantage of positive capacitive feedback between the output-source electrode of the load transistor and the gate electrode thereof to produce a so-called "kicker" voltage which augments or amplifies the normal high level, less one threshold drop, voltage supplied (through the switching MOSFET) to the gate electrode of the load transistor. This produces a substantial overdriving gate-to-source voltage differential which, in turn, produces a substantial increase in output signal transition speed.

Advantageously, with capacitive feedback, the magnitude of the low voltage source need not compensate for voltage drops produced by either the switching or load transistors, but rather, simply be at a level sufficient to produce a useable (TRUE) output voltage for subsequent utilization. More specifically, the low voltage source, connected to the drain electrode of the load transistor, need only provide a voltage level sufficient to allow the source electrode thereof, when not coupled to ground, to rise the minimum output voltage level required for a given application. As such, the dual voltage inverter circuit is thus seen to produce very rapid output signal transitions with minimal circuit power dissipation or, stated another way, to produce a very low speed-power product, which is a desired figure of merit sought in all inverter circuits.

The use of a separate low voltage source for the series connected load and driver transistors also makes it possible for the size of these transistors and, particularly, the channel ratios (W/l) thereof, to be reduced considerably from what would otherwise be required with only the one high voltage source. For reasons described in greater detail hereinafter, these factors not only allow higher MOSFET packing densities to be realized, but effect a significant increase in the yield of such devices. Concomitantly, as the channel width is reduced, the input impedance and the input-output isolation characteristics are increased. In addition, as transistor size and power consumption are directly related and, hence, reduced together, troublesome stray capacitance effects both within each MOSFET structure and between such devices (particularly in high packing density applications) are materially reduced.

BRIEF DESCRIPTION OF THE DRAWINGS

FIG. 1 is a schematic circuit diagram of a dual voltage inverter circuit embodying the principles of the present invention;

FIG. 2 shows a series of waveforms useful in understanding the operation of the circuit depicted in FIG. 1, and FIG. 3 is a truth table illustrating the logic performed by the inverter circuit in FIG. 1.

DETAILED DESCRIPTION OF THE INVENTION

Referring now in greater detail to one preferred illustrative embodiment of the invention as depicted in FIG. 1, an inverter circuit designated generally by the reference numeral 10 comprises three MOSFETs designated 12, 14, and 16. In the specific example illustrated, these MOSFETs are p-channel, enhancement-mode devices, generally of the type described in R. H. Heeren et al. U.S. Pat. No. 3,618,050; Heeren U.S. Pat. No. 3,631,465; or the Polkinghorn et al. patent previously cited.

MOSFET 12 functions as a switching device, and has both a gate electrode 19 and a drain electrode 21 thereof connected to a high voltage source designated simply as $-V_{high}$. The MOSFET 14 functions as a resistive load device and has a drain electrode 23 thereof connected to a low voltage source designated as $-V_{low}$. A gate electrode 25 of the MOSFET 14 is connected to a source electrode 27 of the MOSFET 12 through a node 28.

An effective capacitor $C_1$, shown in phantom, is connected between the node 28 and ground. This capacitor is representative of the various inherent electrode established capacitances, as well as other forms of stray capacitances, associated with the three MOSFETs, as discussed further in the aforementioned Heeren and Polkinghorn et al. patents.

Also depicted in FIG. 1 is a positive feedback capacitor $C_2$ which is coupled between an output node 31 and the gate associated node 28. In practice, the capacitor $C_2$ is made considerably larger than the total capacitances represented by the capacitor $C_1$ so as to provide effective and substantially complete positive feedback of the output voltage. More specifically, with the load and driver Mosfets 14 and 16 operating in their preferred, unsaturated regions, the output voltage at the source electrode 33 of the MOSFET 14 preferably swings from near ground or logical 0 (whenever the MOSFET 16 is ON) to the bias voltage $-V_{low}$ representative of a logical 1 (whenever the MOSFET 16 is OFF).

To accomplish this voltage swing, as will be discussed in greater detail hereinbelow, the capacitor $C_2$ feeds back in a preferred mode of operation, an increment of voltage to the gate electrode of the load MOSFET 14 equal to $-V_{Low}$. This feedback "kicker" voltage advantageously augments the static voltage applied to the gate electrode by the $-V_{high}$ source, through the switching MOSFET 12. More specifically, the combined MOSFET 14 gate voltage equals $-V_{high}$, less the threshold voltage drop of MOSFET 12, plus $-V_{low}$.

It is thus seen that the combined gate voltages applied to the load MOSFET 14 produces a substantial overdriving gate-to-source voltage differential which significantly allows that device to increase the signal output transition speed and, in particular, turn-OFF speed (i.e., in going from zero to $-V_{low}$ in FIG. 2B) over that realized with only a single $-V_{high}$ source.

In this regard, it should be appreciated that the turn-ON time (i.e., in going from $-V_{low}$ to zero in FIG. 2B), is normally considerably shorter than the turn-OFF time, and is primarily controlled by the driver MOSFET 16. As a matter of fact, the turn-ON time can generally be ignored in comparison to the turn-OFF time in most MOSFET circuits. There are two basic reasons for this normally experienced disparity.

First, and with reference being made to the particular inverter circuit embodied in the present invention, the load MOSFET 14 necessarily exhibits a resistance that typically is ten or more times greater than that of the driver MOSFET 16. As such, for a given value of stray capacitance, the time constant for the load MOSFET 14 is naturally ten or more times greater than that for the driver MOSFET 16.

Secondly, in most inverter circuits, the gate-to-source driver bias remains essentially constant at $-V_{in}$ during switching, whereas the gate voltage applied to the load MOSFET 14 is effectively modulated by the output (source electrode) voltage in a manner that normally results in the gain of the load MOSFET being reduced inversely as the output voltage swing increases. It is these two factors, in particular, that have led to the deleterious transient effects experienced with load MOSFETs heretofore, and has resulted in MOSFET inverter, driver or gating circuits being restricted to low frequency operation.

Significantly, however, in accordance with the principles of the present invention, the utilization of capacitve voltage feedback in the inverter circuit embodied herein produces a substantially higher effective, unmodulated, overdriving gate-to-source voltage differential on the load MOSFET 14 than could otherwise be realized. This increased gate voltage, which produces a substantially increased signal switching (turn-OFF) response time, thus at least partially compensates for the normally experienced slower load versus driver MOSFET response time due to the typically higher resistance exhibited by the former.

In addition, the utilization of a low voltage bias source connected to the drain electrode 23 of the load MOSFET 14 reduces the degree of gate-to-source modulation induced in the device (by restricting the output voltage swing to $-V_{low}$). As such, the gain of the load MOSFET, which varies inversely with the output voltage swing, is not reduced nearly as much as in the case where the output voltage swing is made dependent solely on a $-V_{high}$ voltage source.

Of course, the utilization of a $-V_{low}$ voltage applied to the drain electrode of the load MOSFET 14 substantially reduces the power dissipated therein and further has the salutary effect of allowing closer physical drain-to-source spacings for both the load and driver devices. This, in turn, reduces the overall size of these devices for given channel W/l ratios.

The many advantages realized with the inverter circuit embodied herein may perhaps be further appreciated by briefly considering the circuit MOSFETs from a theoretical, as well as an operational standpoint. The theoretical approach lends itself particularly to a better understanding of how the use of dual power supplies in the present inverter circuit effects a substantial reduction in both individual device and total circuit power dissipation. Dissipated power is primarily dependent on two interrelated MOSFET parameters, namely, the size of the device, which includes the channel width-to-length (W/l) ratio, and the resistance of the device after having been turned ON and operated in the non-saturated region. This resistance is designated as $R_{ON}$. It can be shown that for operation over much of the non-saturated region, whereat the current remains nearly linear, the resistance $R_{ON}$ can simply be approximated by the following equation:

$$R_{ON} = 1/2K\ (V_{GS} - V_T)$$

Inasmuch as the transconductance ($g_m$) of a MOSFET can be shown to equal $2K\ (V_{GS} - V_T)$, the equation for $R_{ON}$ clearly evidences that a relatively high gate voltage not only has the effect of reducing $R_{ON}$, but of increasing the transconductance ($g_m$). Conversely, but to a considerably lesser extent, as the channel ratio W/l increases, the value of $g_m$ likewise increases whereas the resistance $R_{ON}$ decreases. This follows from the fact that the channle ratio W/l is one of the parameters that defines the value of the constant K.

Accordingly, to a limited extent, there is a trade-off between a minimum $R_{ON}$ (partially determinative of the power dissipated in a given MOSFET), and in obtaining a high transconductance ($g_m$), through the utilization of both a maximized gate voltage and a W/l ratio. The latter maximized parameter is not nearly as controlling as the former, however, and so the net result desired, namely, of achieving a minimum resistance $R_{ON}$, and a maximized $g_m$, are both dependent to a large extent on the degree to which the gate voltage exceeds the source voltage of the load-functioning MOSFET in the present inverter circuit.

It, of course, should be appreciated that with respect to inverter cicuits of the type depicted in FIG. 1, there are other factors or parameters that also partially determine the degree of total circuit power dissipated, and the transfer characteristics realized at the output of the circuit. For example, two other significant factors relate to (1) the ratio of the channel dimensions of both the load MOSFET 14 and the inverter MOSFET 16, and (2) the constants fixed by the process (e.g., oxide thickness) for both the load and inverter MOSFETS. The composite ratio of the two above-identified W/l channel ratios is important in insuring that the desired voltage drops will be established across the two serially connected MOSFETs 14 and 16, for both the ON (TRUE input) and OFF (FALSE input) switching states of the latter device.

As for the constants fixed by the process, factors such as temperature and process variables affect both the load and inverter MOSFETs similarily, thus, they effectively cancel out as far as having any material bearing on the transfer characteristics of the composite inverter circuit. As such, the structural design of the MOSFETs utilized in the present inverter circuit present problems concerned primarily with *d-c* requirements and circuit layout (which are also important with respect to minimizing stray capacitance), rather than process control per se.

Attention will now be directed to a typical mode of operation of the inverter circuit, with particular reference to the various waveforms depicted in FIG. 2, and the truth table depicted in FIG. 3. For reference purposes only, all relative signal levels herein will be based on standard "negative logic" used with p-channel, enhancement-mode devices, wherein the most negative input or output signal is defined as a logical 1 and the most positive (or ground) signal is a logical 0. As part of this logic nomenclature, a "FALSE" input signal is defined as the most positive (or zero) signal, and a "TRUE" input signal is defined as the most negative signal.

Starting at a time $t_1$, when a negative "TRUE" input data signal (curve A, FIG. 2) is first applied to the gate electrode 37 of the driver MOSFET 16, that device is turned ON. This establishes a ground-discharge path for the output node 31, through the MOSFET 16. This results in the output signal being pulled up (or inverted) in going through a transition (turn-ON state), namely, from a previous $-V_{low}$ voltage level, for reasons later explained, to a level at or near zero (representative of a logical 0), as depicted in FIG. 2B. The turn-ON of driver MOSFET 16, of course, also provides a *d-c* ground return path for the feedback capacitor $C_2$, thereby allowing $C_2$ to charge to the static potential of node 28. During the period of time defined between $t_1$ and $t_2$, all three MOSFETs, namely, switching MOSFET 12, load MOSFET 14, and driver MOSFET 16 are ON (i.e., conducting *d-c* current therethrough).

At time $t_2$, a "FALSE" or zero input signal applied to the gate electrode 37 of the driver MOSFET 16 immediately turns that device OFF. This effectively isolates the output node 31 from ground (or some other more positive reference level). As such, the output node 31 and hence, the output signal, rapidly swings negative toward $-V_{low}$, as a result of the fact that the load MOSFET 14 continues to remain ON at all times.

It should be noted at this point that it is the feedback capacitor $C_2$ that advantageously makes it possible for the output signal, at time $t_2$, to swing not only all the way to $-V_{low}$, but to do it quite rapidly relative to the signal transition that takes place at $t_1$, notwithstanding the aforementioned response time-structural dependent limitations normally associated with load MOSFETs, as distinguished from drivers in circuits of the type in question.

Considered more specifically, at time $t_2$, the capacitor $C_2$ couples the $-V_{low}$-limited output voltage, in a preferred mode of operation described more fully hereinbelow, back to the node 28, which has a continuous static bias applied thereto equal to $-V_{high}$, less the threshold drop of MOSFET 14. As a result, the node 28-associated gate electrode 25, during the time defined between $t_2$ and $t_3$, has both a static and a dynamic bias voltage applied thereto equal (in absolute terms) to: $|-V_{high} + V_{T12}| + |-V_{low}|$, as indicated in FIG. 2C.

The voltage fed back to the gate electrode 25 of MOSFET 14, namely, the increment equal in magnitude to $-V_{low}$, thus constitutes a supplemental or superimposed "kicker" bias voltage which, together with the static voltage applied to the gate electrode, establishes a substantial overdriving gate-to-source voltage that would not be possible without the feedback capacitor. It is this periodic, supplemental feedback "kicker" voltage that constitutes the primary reason for the present inverter circuit effecting a very fast signal transition at time $t_2$.

Considering the importance of the feedback capacitor $C_2$ another way, if it were not utilized, the bias voltage on the gate electrode 25 of the load MOSFET 14 could never exceed $-V_{high}$, less the threshold drop of the MOSFET 12. As such, if the value of $-V_{high}$, for purposes of illustration, was chosen to just equal the combined threshold voltage drops of the MOSFETs 12 and 14 (which sets the minimum level for $-V_{high}$ in order to maintain MOSFET 14 ON), it is seen that the maximum possible gate-to-source voltage differential for the load MOSFET 14 would simply equal the threshold voltage drop of that device. This would be true whether the value of $-V_{low}$ was lower than or even equal to $-V_{high}$.

More importantly, however, such a minimum $-V_{high}$ supply voltage would be impractical as it would not result in any useable logical 1 output signal being produced. A theoretical minimum static voltage level for $-V_{high}$, with or without capacitive feedback, may therefore be expressed by the following voltage relationship: $|-V_{high} + V_{T12}| > |-V_{T14}|$.

From a practical operating standpoint, however, the value of $-V_{high}$ alone, or in combination with capacitive feedback must always produce a voltage on the gate electrode 25 of the load MOSFET 14 which is sufficient to offset the threshold drop of that device and still produce a static source electrode voltage sufficient to directly or indirectly establish a useable logical 1 output signal. This operating requirement may result in either the $-V_{high}$ or $-V_{low}$ supply voltage controlling the magnitude of the output voltage swing. This follows from the fact that the maximum obtainable source electrode voltage in a MOSFET is always limited not only by the gate electrode voltage, less the threshold voltage drop of the device, but by the magnitude of the drain electrode voltage ($-V_{low}$ with respect to MOSFET 14).

In accordance with the priciples of the present invention, minimized circuit power dissipation is realized by making the output voltage swing dependent on, and controlled by, the $-V_{low}$ voltage applied to the drain electrode 23 of the load MOSFET 14. Considered another way, if the output signal is to swing all the way from approximately zero to a voltage level equal to $-V_{low}$ and stay there indefinitely, in response to each input FALSE signal, the maximum static output voltage, dependent on $-V_{high}$, namely, $|-V_{high} + V_{T12} + V_{T14}|$ must at least equal $-V_{low}$. This voltage relationship can be expressed, relative to the static voltage applied to the gate electrode of the load MOSFET 14 as follows: $|-V_{high} + V_{T12}| \geqq |-V_{low} - V_{T14}|$.

The preferred mode of operation for the inverter circuit embodied herein, wherein the level of $-V_{low}$ limits the output voltage swing, may perhaps be better appreciated at this point by examining actual operating circuit conditions based on representative values for the circuit supply voltages and threshold voltage drops. Let it be assumed that $-V_{high}$ equals −24 volts, $-V_{low}$ equals −12 volts, and the threshold drops of the MOS- FETs 12 and 14 equal 5 and 4 volts, respectively. Under these operating conditions it is seen that the static voltage applied to the gate electrode 25 of the load MOSFET 14 will equal $-V_{high}$, less $V_{T12}$, or $-24 + 5 = -19$ volts. Without considering the effect of capacitive feedback for the moment, and if $-V_{low}$ was equal to $-V_{high}$, the static output voltage swing would then seemingly simply equal the difference between approximately zero (in the typical case)) and $-V_{high} + V_{T12} + V_{T14}$, or $-15$ volts. However, with the drain electrode 23 biased at $V_{low}$, the output cannot rise above that level, namely, $-12$ volts in the illustrative example.

Nevertheless, and very significantly, with capacitive voltage feedback, $C_2$ periodically feeds back to the gate electrode 25 a magnitude of voltage equal to $-V_{low}$ even if the above-defined static output voltage swing due to $-V_{high}$ is less than $-V_{low}$. In the latter case, however, the voltage fed back to the gate electrode will gradually decay over a period of time to the static circuit voltage conditions, primarily because of leakage current in capacitors $C_1$ and $C_2$. In that case, while the output voltage may dynamically swing to $-V_{low}$, it will eventually decay with time to $-V_{high} + V_{T12} + V_{T14}$, an output level depicted by the dashed lines in FIG. 2B.

Returning to the present operating example under consideration, however, the static output voltage swing due to only $-V_{high}$ is equal to $-15$ volts, which is $-3$ volts more negative than $-V_{low}$. Accordingly, it is seen that $-V_{low}$ not only determines the upper established limit of the output voltage swing from the mode of operation in question, but also determines the magnitude of the "kicker" voltage fed back to the gate electrode 25 of the MOSFET 14.

As such, it becomes readily apparent that the gate electrode 25 is periodically biased (during each input FALSE signal) to a combined (static and dynamic) voltage of: $|-V_{high} + V_{T12}| + |-V_{low}|$ or $|-24 + 5| + |-12| = -31$ volts. This combined voltage provides a substantial overdriving gate-to-source voltage differential over that realized without capacitive feedback, even though the output voltage cannot become more negative than the drain electrode bias of $-V_{low}$ ( $-12$ volts).

From the above typical mode of operation described, it becomes readily apparent that when: $|-V_{high} + V_{T12} + V_{T14}| = |-V_{low}|$, then the above-defined equality: $|-V_{high} + V_{T12}| = |-V_{low} + V_{T14}|$ is satisfied and the output voltage swing rises to and stabilizes at the level of $-V_{low}$.

The only time that all of the feedback voltage equal to $-V_{low}$ cannot be fed back and superimposed on the static bias applied to the gate electrode 25 of the MOSFET 14 is when these two combined voltages exceed $-V_{high}$, plus the threshold drop associated with MOSFET 12. If that happens, MOSFET 12 effectively operates as a voltage clamp, with conduction simply reversing in that device so as to hold the gate electrode 25 at $-V_{high}$ $-V_{T12}$ until the driver MOSFET 16 is again turned ON. At that time the output voltage goes to essentially zero, which effectively removes the previously applied feedback voltage from the gate electrode 25.

As for any preferred voltage or range of voltage for $-V_{low}$, it suffices to say that $-V_{low}$ should be as low as possible relative to $-V_{high}$ so as to conserve as much (load MOSFET 14 and driver MOSFET 16) *d-c* power as possible, while still producing a practical, useable logical 1 output. In this regard, it should be fully appreciated that there are no threshold voltage drop restrictions imposed on the $-V_{low}$ supply, as distinguished from the case with respect to the $-V_{high}$ supply. It is this fact, of course, that allows total *d-c* circuit power dissipation to be reduced substantially over prior inverter circuits utilizing a single $-V_{high}$ voltage supply.

In summary, it has been shown that the *d-c* coupled load MOSFET 14, and the inverter MOSFET 16, in particular, may be made smaller through the utilization of both high and low voltage supplies. This, of course, also advantageously allows a reduction in the individual MOSFET channel W/l ratios and, may, depending on the relationship between the input and output voltage level requirements, allow a reduction in the composite MOSFET 14 channel W/l ratio to the MOSFET 16 W/l ratio. Such reductions in device size and in channel ratios are very important in minimizing both total circuit area, and total circuit power dissipation requirements. All of these factors, of course, contribute to the present inverter circuit also effecting increases in input impedance, in input-output isolation, and in product yield, as well as a reduction in stray capacitances.

While specific embodiments and examples of the present invention have been described in detail, it will be obvious that various modifications may be made and alternatives provided without departing from the spirit and scope of the invention. For example, with respect to possible variations in certain of the inverter circuit devices, it should be apparent that the switching MOSFET 12 could comprise any type of high resistance basing device or circuitry capable of producing the requisite MOSFET 14 gate voltage, and without allowing appreciable leakage current there-through. This could be accomplished, for example, through the utilization of a discrete or solid state diode that could be dimensioned and polorized so as to clamp the gate electrode 25 at $-V_{high}$, plus the diode forward voltage drop ($V_{DF}$), whenever the input signal is TRUE and turn OFF whenever the input signal is FALSE (resulting in the the gate electrode swinging more negative because of capacitive feedback).

Similarly, it should be appreciated that the inverter MOSFET 16 may comprise any other device or circuit that is voltage-responsive, for example, and capable of selectively establishing either an essentially short circuit or an open circuit condition along a path defined between the output node 31 and ground (or equivalent thereof).

What is claimed is:

1. A logic circuit having input and output terminals comprising:

first switching means having first and second terminals with a variable resistive path defined therebetween, and an actuable control terminal for selectively switching said path from a first state exhibiting a relatively high value of resistance to a second state exhibiting a relatively low value of resistance, said first terminal being connected to the output terminal, said second terminal being connected to a circuit ground return, and said control terminal being connected to the input terminal, a first voltage source producing a substantially constant low level bias voltage, a field-effect load transistor having source, drain and gate electrodes, respectively, said drain electrode being connected to said first low level voltage source and said source electrode being connected to the output terminal, a second substantially constant voltage source for producing on the gate electrode of said load transistor a bias voltage at a level higher than that of said first voltage source, capacitor means connected between said source electrode and said gate electrode of said load transistor, and having charging and discharging states respectively responsive to the relatively low and high resistance switching states of said first switching means, said capacitor means feeding back output voltage to the gate electrode of said load transistor at the beginning of each high resistance state of said first switching means, said feedback voltage being sufficient, when combined with the voltage supplied by said second voltage source, to produce a substantial overdriving gate-to-source electrode voltage differential so as to produce a rapid output signal transition in the direction toward and reaching the voltage level of the drain electrode of said load transistor, second switching means connected between said second voltage source and said gate electrode of said load transistor for establishing a relatively low resistance interconnection there-between during, and in response to, each successive period when the path of said first switching means exhibits a low resistance state, and for establishing said interconnection as a relatively high resistance during, and in response to, each successive period when the path of said first switching means exhibits a high resistance state.

2. An inverter circuit in accordance with claim 1 wherein said field-effect load transistor is of the MOSFET type, and wherein said first switching means also comprises a MOSFET, with said control, first and second terminals thereof comprising gate, drain, and source electrodes, respectively.

3. An inverter circuit in accordance with claim 2 wherein said second switching means also comprises a MOSFET having a gate, a drain, and a source electrode, with both the drain and gate electrodes thereof being connected to said second voltage source, and said associated source electrode being connected to the gate electrode of said load transistor.

4. An inverter circuit comprising:

a first substantially constant low level voltage source, a second substantially constant voltage source producing a voltage level higher than that of said first source, a first field-effect transistor having first and second electrodes and a gate electrode, with at least said gate electrode being connected to said second voltage source, and said first electrode being biased to a level not less than the threshold drop of said first transistor relative to the level of said second voltage source, a second field-effect transistor having first and second electrodes and a gate electrode, the first electrode being connected to said first voltage source, and the gate electrode thereof being connected to the second electrode of said first transistor, a third input signal responsive field-effect transistor having first and second electrodes and a gate electrode, with said first electrode thereof being connected to the second electrode of said second transistor, and with said defined interconnection further providing an output, said gate electrode of said third transistor functioning as an input signal terminal, and, positive feedback means connected between said second electrode of said second transistor and said gate electrode thereof, said feedback means feeding back to the gate electrode of said second transistor at least a portion of the output signal established during each successive period in which an input signal has a voltage level which turns OFF said third transistor.

5. An improved logic circuit of the type including:

A. switching means for selectively establishing either an "ON" (essentially short circuit condition) or an "OFF" (essentially open circuit condition) between first and second terminals thereof, said second terminal being connected to circuit ground;

B. a field-effect transistor having a gate electrode and first and second controlled terminals, said first controlled terminal being connected to a supply voltage and said second controlled terminal being connected to the first terminal of said switching means and to an output terminal, so that the transistor when ON (1) conducts the supply voltage to ground through the switching means when the switching means is also ON, and (2) conducts the supply voltage to the output terminal when the switching means is OFF;

C. voltage biasing means for turning the transistor ON, the biasing means having an input terminal, and an output terminal connected to said gate electrode of said transistor; and D. voltage feedback means connected between said second controlled terminal and said gate electrode of said transistor for feeding back to said gate electrode a kicker voltage related to the increase in output voltage at said output terminal when said switching means changes from ON to OFF, the kicker voltage adding to the voltage applied by the biasing means to overdrive the gate and augment the ON state of the transistor;

wherein the improved circuit is characterized in that two distinct supply voltages are provided, both of the polarity required to turn the transistor ON, the supply voltages being connected in the circuit and related to each other as follows:

1. the first supply voltage is a relatively high voltage in terms of absolute magnitude compared to the second;

2. the higher supply voltage is connected to the input terminal of the biasing means so as to provide a biasing voltage applied to the gate when said switching means is ON, the magnitude of the higher supply voltage being selected to provide such a biasing voltage to the gate which is greater than the magnitude of the lower supply voltage by at least the threshold voltage drop of the transistor, and which is also sufficient to turn the transistor ON when the switching means is ON;

3. The lower supply voltage is connected to the first controlled terminal of the transistor, the magnitude of the lower supply voltage being selected to provide a useable output voltage through the transistor to the output terminal when the switching means is OFF, the lower supply voltage serving through the transistor and the feedback means to provide a kicker voltage as recited in clause (D) which is lower than the biasing voltage applied to the gate electrode by the biasing means, the combination of the relatively higher biasing voltage and the relatively lower kicker voltage serving to overdrive the gate of the transistor to accelerate the response time of the transistor when the switching means turns OFF, while minimizing the power dissipation to ground resulting when the switching means is ON.

* * * * *